(12) United States Patent
Lamarche (10) Patent No.: US 9,214,586 B2
(45) Date of Patent: Dec. 15, 2015

(54) SEMICONDUCTOR SOLAR CELL PACKAGE

(75) Inventor: Paul F. Lamarche, Morgan Hill, CA (US)

(73) Assignee: Solar Junction Corporation, San Jose, CA (US)

( * ) Notice: Subject to any disclaimer, the term of this patent is extended or adjusted under 35 U.S.C. 154(b) by 437 days.

(21) Appl. No.: 13/092,555

(22) Filed: Apr. 22, 2011

(65) Prior Publication Data

US 2011/0265871 A1 Nov. 3, 2011

Related U.S. Application Data

(60) Provisional application No. 61/330,106, filed on Apr. 30, 2010.

(51) Int. Cl.
| | |
|---|---|
| *H01L 31/042* | (2014.01) |
| *H01L 31/00* | (2006.01) |
| *H01L 31/048* | (2014.01) |
| *H01L 31/052* | (2014.01) |
| *H01L 31/02* | (2006.01) |
| *H01L 31/05* | (2014.01) |

(52) U.S. Cl.
CPC ........ *H01L 31/048* (2013.01); *H01L 31/02008* (2013.01); *H01L 31/052* (2013.01); *H01L 31/0504* (2013.01); *Y02E 10/50* (2013.01)

(58) Field of Classification Search
CPC ........................... H01L 31/048; H01L 31/052
USPC ................................................. 136/259, 246
See application file for complete search history.

(56) References Cited

U.S. PATENT DOCUMENTS

| | | | |
|---|---|---|---|
| 3,903,427 A | * | 9/1975 | Pack .......................... 250/208.2 |
| 4,062,698 A | * | 12/1977 | Blakeslee et al. ............. 136/246 |
| 4,180,414 A | | 12/1979 | Diamond et al. |
| 4,209,347 A | | 6/1980 | Klein |

(Continued)

FOREIGN PATENT DOCUMENTS

| | | |
|---|---|---|
| EP | 2254156 A2 | 11/2010 |
| WO | 2011/137305 | 11/2011 |

(Continued)

OTHER PUBLICATIONS

International Search Report and Written Opinion corresponding to the PCT application No. PCT/US2011/034485, date of mailing Aug. 3, 2011, 9 pages total.

(Continued)

*Primary Examiner* — Jeffrey T Barton
*Assistant Examiner* — Uyen Tran (57) ABSTRACT

A package for a solar cell is provided having laminates formed by stacked lead frames to form an integral package supporting a solar cell structure. Lead frames serve as a heat sink, raised portions match a cavity in a middle lead frames that contain and hold individual solar cell chips in place. Beveled interior edges of a carrier lead frame are in electrical contact with bus bars on the periphery of a suspended solar cell and form the electrical connection for the cell, maximizing current handling capability and allowing the use of spring tension and/or a bonding compound for additional connection strength and integrity. Such a "stackable" semiconductor package requires no ribbon bonding and has multiple bias options, maximum scalability, enhanced moisture resistance, and multiple attachment options for heat sink attachment.

10 Claims, 8 Drawing Sheets

(56) References Cited

U.S. PATENT DOCUMENTS

| | | | |
|---|---|---|---|
| 4,491,681 A | | 1/1985 | Kirpich |
| 4,830,678 A | * | 5/1989 | Todorof et al. ............... 136/259 |
| 4,834,805 A | * | 5/1989 | Erbert ........................ 136/246 |
| 4,999,060 A | | 3/1991 | Szekely et al. |
| 5,118,361 A | | 6/1992 | Fraas et al. |
| 5,460,659 A | | 10/1995 | Krut |
| 5,500,052 A | | 3/1996 | Horiuchi et al. |
| 5,935,345 A | | 8/1999 | Kuznicki |
| 5,944,913 A | | 8/1999 | Hou et al. |
| 6,281,426 B1 | | 8/2001 | Olson et al. |
| 6,623,283 B1 | | 9/2003 | Torigian et al. |
| 6,663,982 B1 | | 12/2003 | Stephens et al. |
| 7,449,630 B2 | * | 11/2008 | Ho et al. ........................ 136/255 |
| 7,514,782 B2 | | 4/2009 | Hiramatsu et al. |
| 7,727,795 B2 | | 6/2010 | Stan et al. |
| 7,851,693 B2 | | 12/2010 | Fork et al. |
| 2003/0029497 A1 | | 2/2003 | Tanaka |
| 2004/0119149 A1 | | 6/2004 | Yin Pang et al. |
| 2005/0072457 A1 | | 4/2005 | Glenn |
| 2005/0155641 A1 | | 7/2005 | Fafard |
| 2006/0162768 A1 | | 7/2006 | Wanlass et al. |
| 2006/0163596 A1 | | 7/2006 | Kim et al. |
| 2006/0185716 A1 | * | 8/2006 | Murozono et al. ............ 136/250 |
| 2006/0240599 A1 | | 10/2006 | Amano et al. |
| 2007/0089774 A1 | | 4/2007 | Lasich |
| 2007/0090517 A1 | | 4/2007 | Moon et al. |
| 2007/0240760 A1 | | 10/2007 | Gronet |
| 2007/0241450 A1 | | 10/2007 | Hiramatsu et al. |
| 2007/0290287 A1 | | 12/2007 | Freedman |
| 2008/0105298 A1 | | 5/2008 | Lu et al. |
| 2008/0135088 A1 | * | 6/2008 | Corrales ........................ 136/246 |
| 2008/0150064 A1 | | 6/2008 | Zimmerman et al. |
| 2008/0185040 A1 | | 8/2008 | Tom et al. |
| 2008/0190480 A1 | * | 8/2008 | Joshi ........................... 136/246 |
| 2008/0230110 A1 | | 9/2008 | Freedman |
| 2008/0315398 A1 | | 12/2008 | Lo et al. |
| 2009/0020152 A1 | * | 1/2009 | Lin ............................. 136/251 |
| 2009/0064994 A1 | | 3/2009 | Weatherby et al. |
| 2009/0086478 A1 | | 4/2009 | Sanroma et al. |
| 2009/0120500 A1 | * | 5/2009 | Prather et al. ................ 136/259 |
| 2009/0159126 A1 | | 6/2009 | Chan |
| 2009/0229659 A1 | | 9/2009 | Wanlass et al. |
| 2009/0255575 A1 | | 10/2009 | Tischler |
| 2009/0266395 A1 | | 10/2009 | Murthy et al. |
| 2009/0272438 A1 | | 11/2009 | Cornfeld |
| 2009/0298218 A1 | * | 12/2009 | Federici et al. ............... 438/65 |
| 2010/0037935 A1 | | 2/2010 | Viad et al. |
| 2010/0051085 A1 | | 3/2010 | Wiedman et al. |
| 2010/0132765 A1 | | 6/2010 | Cumpston et al. |
| 2010/0139752 A1 | | 6/2010 | Fang |
| 2010/0180936 A1 | | 7/2010 | Kim |
| 2010/0294362 A1 | | 11/2010 | Christ et al. |
| 2010/0313954 A1 | | 12/2010 | Seel et al. |
| 2010/0326429 A1 | | 12/2010 | Cumpston et al. |
| 2010/0326492 A1 | * | 12/2010 | Tan et al. ..................... 136/246 |
| 2011/0048535 A1 | | 3/2011 | Nagyvary et al. |
| 2011/0108113 A1 | | 5/2011 | Arikawa |
| 2012/0025618 A1 | * | 2/2012 | Erickson et al. ............... 307/77 |
| 2012/0199194 A1 | | 8/2012 | Lamarche et al. |
| 2012/0199195 A1 | | 8/2012 | Lamarche |
| 2012/0199196 A1 | | 8/2012 | Lamarche |

FOREIGN PATENT DOCUMENTS

| | | |
|---|---|---|
| WO | 2012/106160 | 8/2012 |
| WO | 2012/106165 | 8/2012 |

OTHER PUBLICATIONS

International Search Report and Written Opinion of the International Searching Authority for PCT Application No. PCT/US2012/022611, mailed on Jun. 21, 2012, 9 pages.

Non-Final Office Action mailed on Dec. 19, 2012, for U.S. Appl. No. 13/224,204, 14 pages.

Final Office Action mailed on Dec. 17, 2013, for U.S. Appl. No. 13/224,232, 19 pages.

Non-Final Office Action mailed on Nov. 21, 2013, for U.S. Appl. No. 12/944,361, 11 pages.

Non-Final Office Action mailed on Aug. 1, 2013, for U.S. Appl. No. 13/224,204, 15 pages.

Non-Final Office Action mailed on Mar. 14, 2013, for U.S. Appl. No. 13/224,232, 16 pages.

Non-Final Office Action mailed on Dec. 20, 2013, for U.S. Appl. No. 13/224,181, 10 pages.

International Preliminary Report on Patentability corresponding to the PCT Application No. PCT/US2011/034485, mailed on Nov. 15, 2012, 7 pages.

International Search Report and Written Opinion corresponding to PCT Application No. PCT/US2011/036486, mailed on Aug. 25, 2011, 12 pages.

International Search Report and Written Opinion corresponding to PCT Application No. PCT/US2010/056800, mailed on Jan. 26, 2011, 8 pages.

Cotal et al., "III-V multijunction solar cells for concentrating photovoltaics", Energy and Environment Science, Dec. 10, 2008, pp. 174-192.

Friedman et al., "Breakeven Criteria for the GaInNAs Junction in GaInP/GaAs/GaInNAs/Ge Four-junction Solar Cells", Progress in Photovoltaics: Research and Applications, 2002, pp. 331-344.

Garcia et al., "Analysis of Tellurium As N-Type Dopant in GaInP: Doping, Diffustion, Memory Effect and Surfactant Properties", Journal of Crystal Growth 298 2007, pp. 794-799.

Geelen et al., "Epitaxial Lift-Off GaAs Solar Cell From a Reusable GaAs Substrate", Materials Science and Engineering B45, 1997, pp. 162-171.

Green, "Do Built-in Fields Improve Solar Cell Performance?", Progress in Photovoltaics: Research and Applications, 2009, pp. 57-66.

Jackrel et al., "Dilute nitride GaInNAs and GaInNAsSb solar cells by molecular beam epitaxy", Journal of Applied Physics 101, 114916, 2007, pp. 1-8.

Janotti et. al., "Mutual Passivation of Electrically Active and Isovalent Impurities in Dilute Nitrides", Physical Review Letters 100, 2008, 045505.

Ng et al., "1EV GANXAS1-X-YSBY Material for Lattice-Matched III-V Solar Cell Implementation on GAAS and GE", Photovoltaic Specialists Conference (PVSC), 2009, 34th IEEE, pp. 76-80.

Ptak et al., "Low-acceptor-Concentration GaInNAs grown by Molecular-beam Epitaxy for High-current p-i-n solar cell applications", Journal of Applied Physics 98, 2005, 094501.

Volz et al., "Optimization of Annealing Conditions of (GaIn)(NAs) for Solar Cell Applications", Journal of Crystal Growth 310, 2008, pp. 2222-2228.

Wu et al., "Band Anticrossing in Highly Mismatched III—V Semiconductor Alloys", Semiconductor Science and Technology 17, 2002, pp. 860-869.

Yamaguchi et al., "Multi-junction III-V solar cells: Current status and future potential", Solar Energy, Jul. 2005, vol. 79, Issue 1, Abstract only.

Yu et. al., "Mutual Passivation of Group IV Donors and Nitrogen in Diluted GaNxAs1-x Alloys", Applied Physics Letters, vol. 83, No. 14, Oct. 6, 2003, pp. 2844-2846.

Notice of Allowance mailed on Jul. 8, 2014, for U.S. Appl. No. 13/224,204, 10 pages.

Final Office Action mailed on Jul. 31, 2013, for U.S. Appl. No. 13/224,181, 14 pages.

Non-Final Office Action mailed on Jul. 7, 2014, for U.S. Appl. No. 13/224,232, 19 pages.

* cited by examiner

SEMICONDUCTOR SOLAR CELL PACKAGE

CROSS-REFERENCES TO RELATED APPLICATIONS

The application claims benefit under 35 USC 119(e) of U.S. Provisional Patent Application No. 61/330,106 filed Apr. 30, 2010, entitled "Semiconductor Solar Cell Package," the content of which is incorporated herein by reference in its entirety.

STATEMENT AS TO RIGHTS TO INVENTIONS MADE UNDER FEDERALLY SPONSORED RESEARCH AND DEVELOPMENT

Not Applicable

REFERENCE TO A "SEQUENCE LISTING," A TABLE, OR A COMPUTER PROGRAM LISTING APPENDIX SUBMITTED ON A COMPACT DISK

Not Applicable

BACKGROUND OF THE INVENTION

This invention relates to packaging for semiconductor photovoltaic devices known generally as solar cells.

Photovoltaic devices present unique problems requiring specialized packaging to achieve desired levels of durability, mechanical integrity, electrical connectivity and convenience of mounting. Because such devices are exposed continuously to a wide range of thermal and weather conditions, packaging must be moisture-proof and tolerant of thermal expansion and contraction. The packaging must also lend itself to a low cost and highly automated manufacturing process. The delicate semiconductor material used as the operative portion of a solar cell must be protected from excessive current by attaching, for example by use of an additional device such as a bypass diode in parallel with the anode and cathode of the device, an operation normally accomplished by wire or ribbon bonding in a manner that may cause high rates of mechanical failure in actual usage. Further, suppliers of photovoltaic cells and systems are increasingly required to guarantee that their products will operate without replacement for long periods of time, in some cases up to 30 years or more. The packaging for such cells must therefore provide durability as well as reliability.

SUMMARY

According to the invention, a package for a solar cell is provided having laminates or stacked lead frames to form an integral package supporting a solar cell structure. A lower layer is a thermally conductive lead frame used as a heat sink. A raised portion of a lead frame matches a cavity in a middle lead frame. A further raised portion matches a cavity in an upper lead frame that contains and holds an individual solar cell chip in place. Beveled interior edges of a carrier lead frame are in surface electrical contact with bus bars on the periphery of the suspended solar cell and form a conductive contact of the cell, maximizing current handling capability and allowing the use of spring tension and/or a bonding compound for additional connection strength and integrity.

A packaged solar cell according to the invention is weatherproof, durable and easily manufactured. One embodiment of the invention employs three metal lead frames that are designed to fit together in a manner that securely holds a multijunction semiconductor solar cell chip, approximately 1 centimeter square, provides electrical connectivity between the electrodes of the chip and the external connections that carry current to and from the chip, and provides appropriate mechanical connections and heat transfer characteristics. The use of lead frames that can be stamped or etched from continuous rolls of a metal or an alloy of various metals allows for the automated packaging of semiconductor chips into completed solar cells. One embodiment of the invention allows for electrical connections to be made between the chip and a protective bypass diode or other external circuitry without the need for complex, time consuming, expensive and vulnerable bonded wire or ribbon interconnections. In addition, integral heat sinks of varying sizes and metals can be used for more efficient and cost effective heat dissipation.

Packaging as described permits the use of standard photovoltaic semiconductor chips having an anode on one surface and a cathode on the other without the need for expensive processing of the chip, extra masks or custom assembly equipment. Use of the invention simplifies the assembly of the solar cell components, both as to the package itself and later for subassembly and connectivity requirements. The package design also allows for scaling the manufacturing process to high volume output in a relatively short time. Other benefits from the invention will become readily apparent to those skilled in the arts of semiconductor design and packaging from the following detailed description in connection with the accompanying drawings.

DETAILED DESCRIPTION OF SPECIFIC EMBODIMENTS

Figure 1:
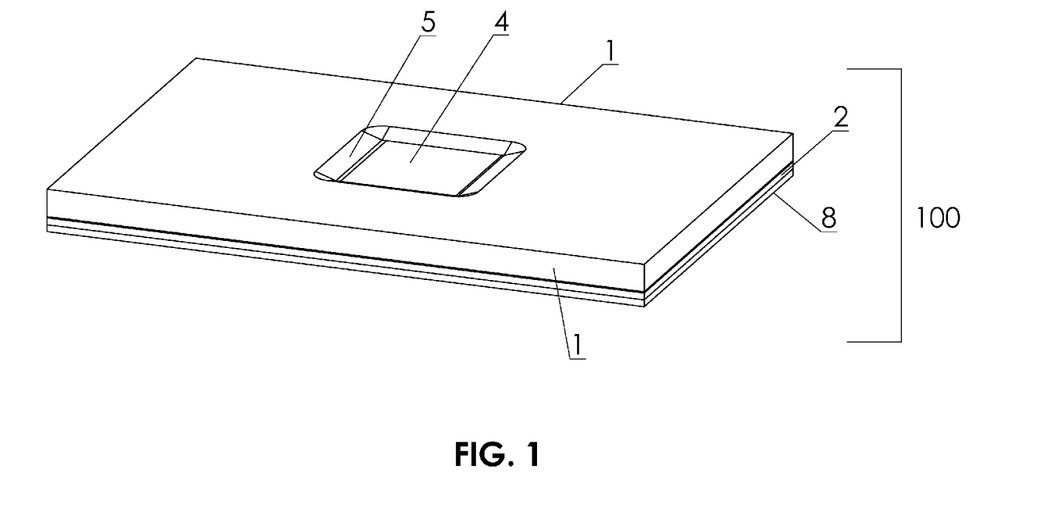
FIG. 1 is a perspective view of a finished and packaged solar cell manufactured in accordance with the invention.
Figure 2:
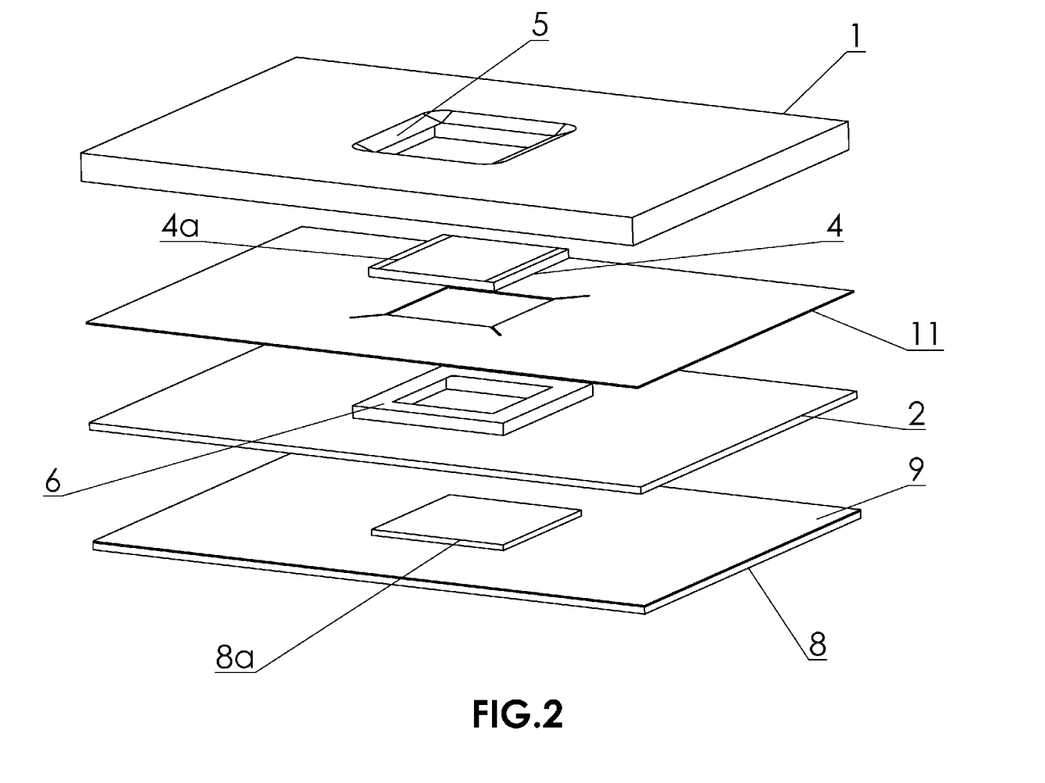
FIG. 2 is an exploded perspective view of the same solar cell showing its various layers as described herein.

FIG. 1 shows a completed solar cell assembled from the various components shown in FIG. 2. The lower layer 8 of the assembly 100 is a metal lead frame used as a heat sink. The raised portion 8a of lead frame 8 matches a raised well 6 through layer 2, which is the middle lead frame. The raised well 6 of lead frame 2 (FIG. 3) matches a cavity in the upper lead frame 1 that contains and holds solar cell chip 4 in place.

Solar cell chip 4 in this embodiment is a III-V multi junction solar cell, but the structure is compatible with other planar chips with any semiconductor material that must be exposed to weather and a wide range of thermal expansion and contraction.

The upper layer 1 of the assembly is the top lead frame designed to mate with lead frames 2 and 8 to form an integral package. The beveled interior edges 5 of lead frame 1 contact electrical bus bars 4a on the periphery of solar cell 4 and form the cathode of the cell. Beveled edge 5 creates a ledge extending over the portion of the chip that contains the bus bars 4a, allowing for surface contact with the bus bars 4a and maximizing current handling capability. This configuration also allows the use of spring tension and/or a bonding compound for additional connection strength and integrity.

Figure 3:
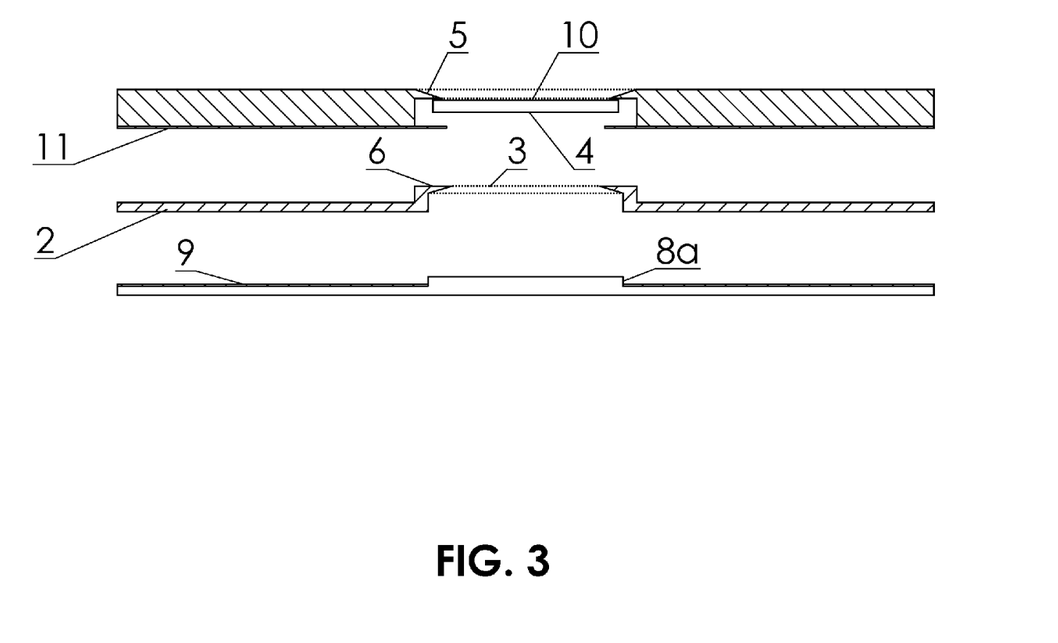
FIG. 3 is a side elevation schematic drawing illustrating one way in which the upper, middle and lower lead frames can be connected to one another.

Referring to FIGS. 1 and 3, the interface formed between the beveled edge 5 of lead frame 1 and the semiconductor bus bars can be shaped to provide a watertight seal for the entire assembly, thereby making the packaged device more moisture resistant. In addition, the well created by the top surface of the frame 1 and the beveled edge 5 can be used as a self leveling dam for the containment of optical matching material.

Referring to FIGS. 2 and 3, electrical insulating material 11 is disposed between the lower surface of lead frame 1 and the upper surface of lead frame 2, thus isolating lead frame 1 electrically from other mechanical interfaces so that the lead frame 1 itself can be used as the cathode contact for solar cell chip 4. One insulating material that can be used for this purpose is Kapton,™ sold by DuPont, but those skilled in the art will recognize that many other insulating products would serve the same purpose. Lead frame 1 is configured mechanically to accept the insertion of the raised well 6 of lead frame 2, the insulating material 11, and a quantity of thermal interface material 3.

Many types of thermal interface material (sometimes referred to as "mastic" or "TIM") may be used as a thermally conductive adhesive and to fill the gaps between the thermal transfer surface at the bottom of the solar cell chip and the upper surface of the heat sink portion of the lower lead frame, thereby insuring maximum transfer of waste heat. In a specific embodiment, Type EK 1000 or a similar mastik such as those manufactured by Dupont may used, but those skilled in the art will recognize that many types of bonding materials could be used.

As can be seen in more clearly in FIG. 3, bottom lead frame 2 is designed to contact the lower surface of solar cell chip 4 so as to apply spring tension while still leaving sufficient spacing and area for the application of the TIM suitable for the bonding application. The raised portion 6 of lead frame 2 is designed to fit into the cavity formed by the lower portion of lead frame 1. Lead frame 2 is designed to make intimate contact with solar cell 4 for providing good thermal transfer and, if required, electrical conductivity. The tapered well 6 of lead frame 2 can provide spring tension against the bottom of solar cell chip 4, which enhances both structural integrity and electrical contact. Lead frame 2, being electrically isolated from lead frame 1 by insulating material 11, can function as the electrical connection to the anode contact for solar cell chip 4.

As further shown in FIGS. 2 and 3, lead frame 2 is configured mechanically to accept the insertion of the raised portion 8a of lower lead frame 8, which acts as a heat sink. The raised portion 8a of lead frame 8 is designed to be inserted into the cavity formed by the raised well 6 of lead frame 2. If lead frame 8 is required to be electrically separate from the solar cell chip, an insulating material 9 can be inserted during assembly to isolate lead frames 2 and 8 and the TIM selected must not be electrically conductive. If, on the other hand, an electrical ground to the heat sink is desired, then the insulating material is not used and an electrically conductive TIM bonding material may be used instead.

Figure 4:
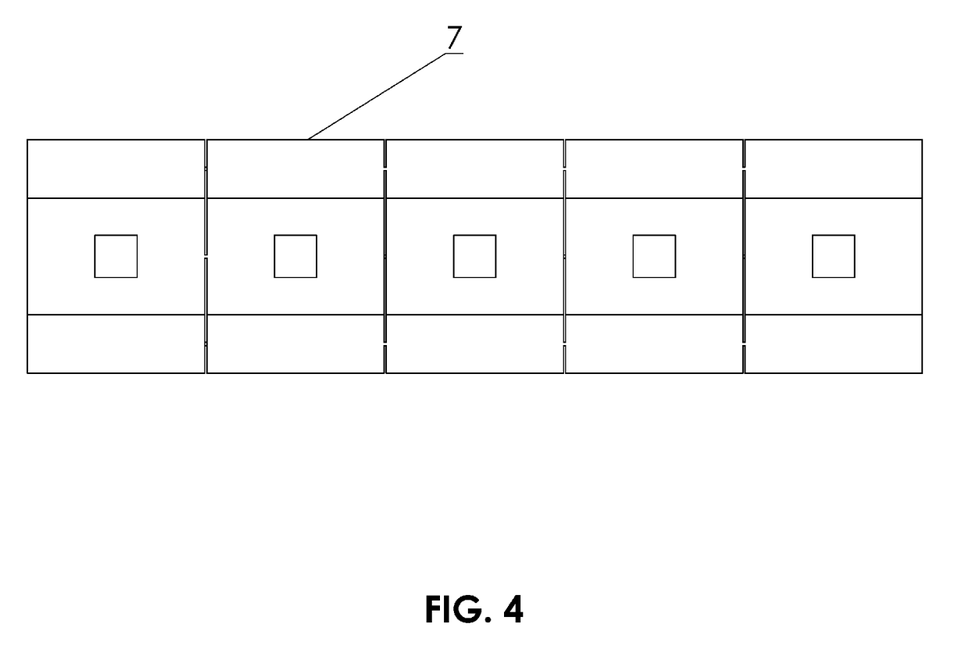
FIG. 4 is a plan view schematic of the assembled lead frames illustrating one way in which the lower lead frame, which serves as a heat sink, can be spot welded to a substantially larger heat sink in actual usage.

FIG. 4 shows the top view of assembled lead frames 1, 2 and 8. In the assembled configuration there are multiple completed solar cells. In this view it can be seen that by making lead frame 8 wider than lead frame 1, protrusions 7 are created that form "ears" that can be used as a hold down or bonding feature for the next step in the assembly process. These protrusions 7 can be tack welded or mechanically bolted to a larger heat sink (not shown).

Figure 5:
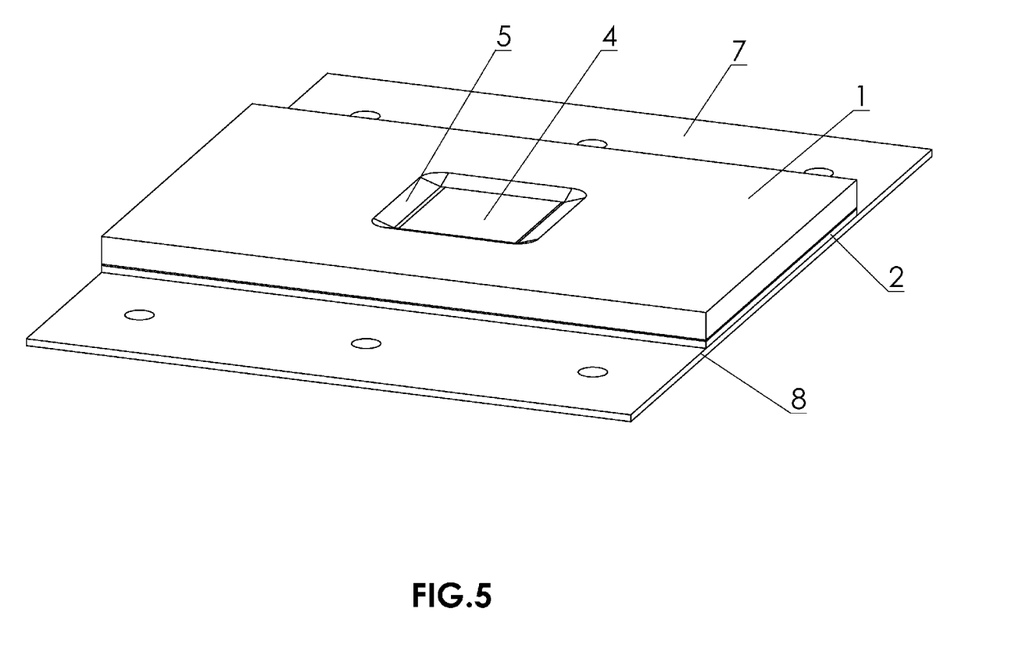
FIG. 5 is a perspective drawing further illustrating the manner in which the lower lead frame can be spot welded to a larger heat sink.

If desired, lead frame 8 can also be tack welded to lead frame 2. Further, as can be seen in FIGS. 4 and 5, lead frame 8 can be made wider than the other two lead frames to form flanges 7 which in the sub-assembly can be used for attaching the semiconductor package to a larger heat sink.

Figure 6:
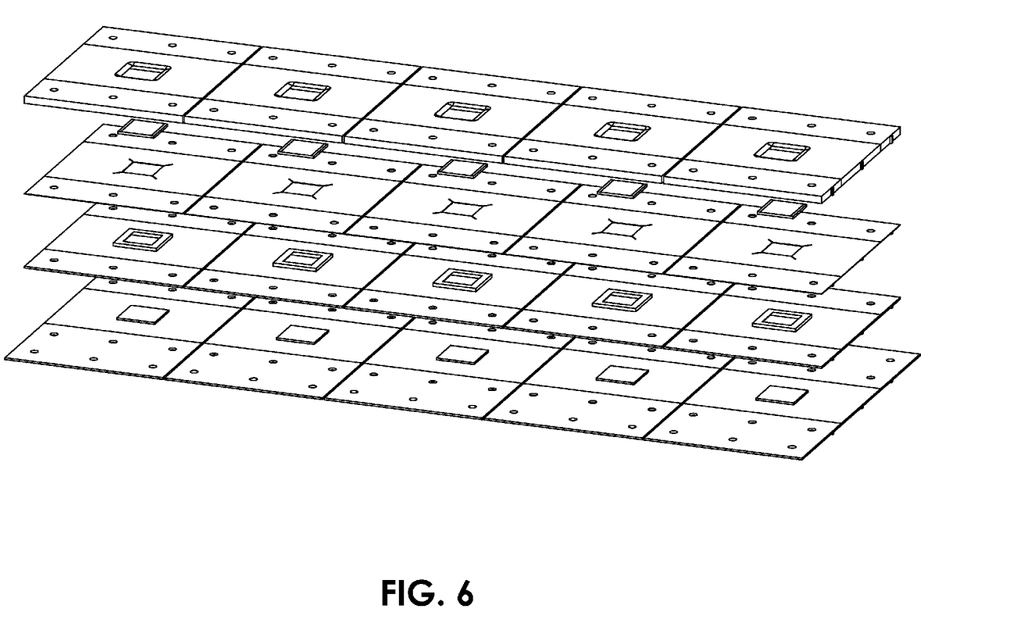
FIG. 6 is a perspective view of strips of lead frame material and the solar cell chips that will be mounted into the spaces shown.

FIG. 6 shows a strip of five packaged solar cells made from continuous strips of the lead frame materials. Those skilled in the art will recognize that, by maintaining electrical conductivity between the adjacent cells in the strip, multiple cells can be connected in parallel, whereas separation of the individual cells will allow them to be connected in other ways.

The lead frames can be made of different base materials and/or alloys for the purpose of thermal expansion matching, thermal transfer and electrical conductivity. Further, the features specified in the lead frames can be varied in all dimensions to adapt to a variety of chip sizes, layouts and design variations. Also, a variety of conductive and non-conductive materials may be used, either in liquid form for auto dispensing or in solid form for mechanical placement.

Materials can be deposited in specified locations for insulating a surface or for electrical and thermal conductivity. This "stackable" approach to semiconductor assembly packaging is not limited to a lead frame configuration, but could also be applied to ceramic assembly materials and PC board type materials, such as, but not limited to FR4 and G10.

Figure 7:
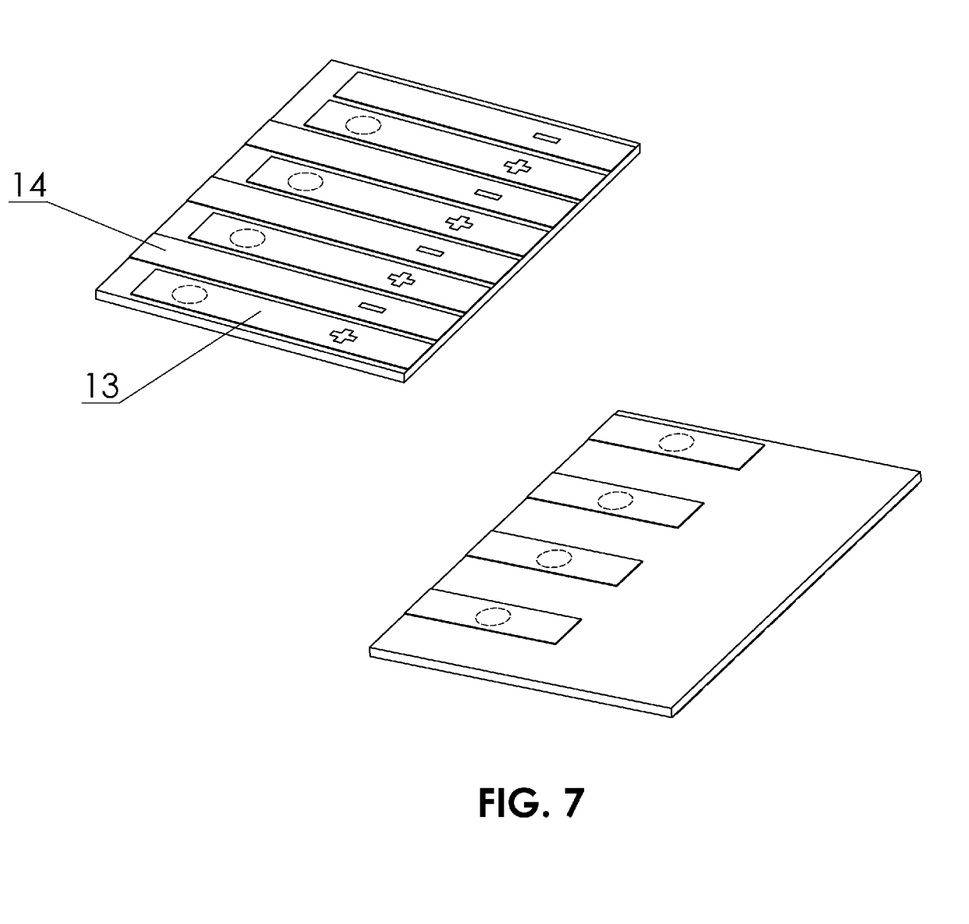
FIG. 7 is a printed circuit board that can be used with the packaged solar cells for making electrical connections to external circuitry necessary for their use.
Figure 8:
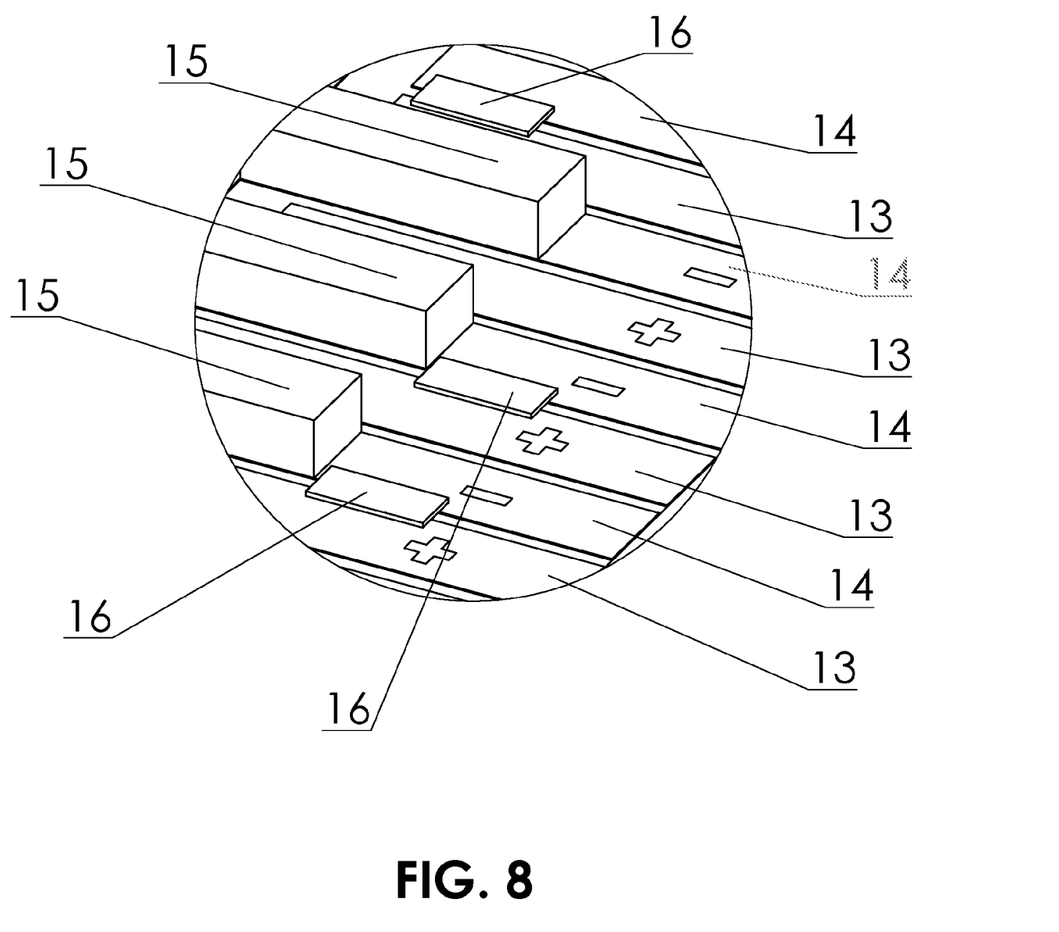
FIG. 8 shows the upper lead frame with extension prongs that connect the cathodes of the solar cell to the printed circuit board and the connection of bypass diodes in a manner that does not employ wire or ribbon bonding to the surface of the semiconductor.

FIGS. 7 and 8 show the manner in which a printed circuit board can be used in conjunction with the packaged solar cells for connectivity to other cells and to other types of circuitry. Traces 13 and 14 in FIG. 7 are the corresponding connections for one solar cell chip that allows multiple cells to be connected in a variety of different ways. The top element of FIG. 7 shows the top of the board and the bottom element of FIG. 7 shows the bottom with only the ground connections, which in turn can be mounted electrically to the frame of a larger assembly (not shown). FIG. 8 shows a detail of how the upper lead frame can be fashioned with fingers 15 extending to connect the cathode of the chip to the cathode terminals of the board. By placing the conductive traces sufficiently close together to allow bypass diodes such as diode 16 to be placed across the space between them, the diodes can be packaged without unreliable and expensive wire or ribbon bonding techniques.

The foregoing describes an assembly that can be automatically constructed. In particular, the automated process for constructing a weather resistant solar cell may comprise forming at least one opening in a first continuous strip of packaging material sufficient to admit sunlight, positioning at least one photovoltaic semiconductor chip below the first continuous strip to receive sunlight through the opening, forming a second continuous strip of packaging material with a projection extending into a first cavity in the first strip, and bonding portions of the first continuous strip and the second continuous strip together thereby to secure in place the semiconductor chip. The continuous strips may be made of metal, be electrically isolated from one another and serve as connectors to the anode and cathode terminals of the semiconductor chip. Alternatively, a third continuous strip of packaging material having at least one projection extending into a cavity in said second strip may be bonded to the second strip in a manner that facilitates heat dissipation While the foregoing written description of the invention will enable one skilled in the art to make and use the invention, those so skilled will understand and appreciate the number of variations, combinations, and equivalents of the specific embodiment, method and examples herein. For example, one of skill in the art will recognize that the embodiment described herein is for n-on-p type solar cells, but that p-on-n type solar cells packaged within the same lead frame structure are also contemplated. The invention should therefore not be limited by the above described embodiment, methods and examples, but by all embodiments and methods within the scope and spirit of the invention.

What is claimed is:

1. An assembly, comprising:
    a first electrically conductive layer, wherein the first electrically conductive layer is electrically conductive and comprises:
        a first top surface;
        a first bottom surface;
        a first ledge extending from the first top surface and edges defining a first window; and
        a first cavity within the lower surface, wherein the first cavity is bounded by the first ledge and is aligned with the first window;
    a photovoltaic device disposed within the first cavity, wherein the photovoltaic device comprises:
        a top an upper surface comprising a cathode, wherein the cathode is electrically connected to the first ledge; and bottom surface comprising an anode;
    a first insulating material underlying the bottom surface of the first electrically conductive layer and extending into a portion of the first cavity;
    a second electrically conductive layer underlying the first insulating material, wherein the second electrically conductive layer comprises:
        a second top surface;
        a second bottom surface;
        a first raised portion, wherein the first raised portion is disposed within the first cavity and comprises a second ledge extending from the second top surface and defining a second window, wherein,
            the second ledge is electrically connected to the anode; and
            the second electrically conductive layer is electrically insulated from the first electrically conductive layer by the first insulating material; and
        a second cavity within the first raised portion and aligned with the first cavity and with the second window; and
    a third layer underlying the second electrically conductive layer, wherein,
        the third-layer comprises a second raised portion; and
        the second raised portion is disposed within the second cavity; and
        a top surface of the second raised portion is in thermal contact with the bottom surface of the photovoltaic device.

2. The assembly of claim 1, wherein the third layer is thermally conductive and electrically insulating.

3. The assembly of claim 1, wherein the third layer is electrically conductive.

4. The assembly of claim 1, comprising a second insulating material disposed between a portion of the second layer and the third layer, wherein the second layer is electrically insulated from the third layer.

5. The assembly of claim 1, comprising an index matching material disposed within the first window and coating the top surface of the photovoltaic device.

6. The assembly of claim 1, comprising a thermal interface material disposed between the bottom surface of the photovoltaic device and the second raised portion of the third layer.

7. The assembly of claim 1, wherein the first layer comprises fingers interconnecting the cathode of the photovoltaic device to terminals on a printed circuit board and to bypass diodes.

8. The assembly of claim 1, wherein each of the first layer, the second layer, and the third layer comprise lead frames.

9. A method for assembling a solar cell package, comprising:
    providing a third layer, wherein, the third layer comprises a second raised portion;
    disposing a second electrically conductive layer on the third layer, wherein the second layer comprises:
        a second top surface;
        a second bottom surface;
        a first raised portion comprising a second ledge extending from the second top surface and defining a second window on an upper surface; and
        a second cavity within the first raised portion and aligned with the second window;
    disposing a photovoltaic device over the second window and on the second ledge, wherein the photovoltaic device comprises:
        a top surface comprising a cathode; and
        a bottom surface comprising;
    disposing a first insulating layer on the second electrically conductive layer; and
    disposing a first layer on the photovoltaic device and on the first insulating layer, wherein the first layer comprises:
        a first top surface;
        a first bottom surface; and
        a first ledge extending from the first top surface and defining a first window;
    to provide a solar cell package;
    wherein the cathode is electrically interconnected to the first ledge and the anode is electrically interconnected to the second ledge.

10. A photovoltaic system comprising at least one assembly of claim 1.

* * * * *